United States Patent [19]

Barraud et al.

[11] Patent Number: 4,803,011

[45] Date of Patent: Feb. 7, 1989

[54] ELECTRICALLY CONDUCTING FILMS COMPRISING AT LEAST ONE MONOMOLECULAR LAYER OF AN ORGANIC CHARGE TRANSFER COMPLEX

[75] Inventors: André Barraud, Bures sur Yvette; Annie Ruaudel, Verrieres le Buisson; Michel Vandevyver, Chatenay Malabry, all of France

[73] Assignee: Commissariat a l'Energie Atomique, Paris, France

[21] Appl. No.: 732,413

[22] Filed: May 9, 1985

[30] Foreign Application Priority Data

May 10, 1984 [FR] France ............................ 84 07214

[51] Int. Cl.$^4$ .............................................. H01B 1/00
[52] U.S. Cl. .................................... 252/500; 252/518; 428/332; 428/338; 428/411.1
[58] Field of Search ....................... 252/500, 512, 518; 428/332, 338, 411.1; 260/396 N, 396 R; 556/45, 64, 136, 13

[56] References Cited

U.S. PATENT DOCUMENTS

| | | | |
|---|---|---|---|
| 3,424,698 | 1/1969 | Lupinski et al. | 252/500 |
| 4,359,411 | 11/1982 | Kim et al. | 252/518 |
| 4,568,494 | 2/1986 | Jonas et al. | 252/500 |
| 4,622,266 | 11/1986 | Kim | 252/500 |
| 4,663,078 | 5/1987 | Jonas et al. | 252/500 |

OTHER PUBLICATIONS

Journal of Pharmaceutical Sciences, vol. 58, No. 12, (Dec. 1969), "Monomolecular Film Properties of Protective and Enteric Film Formers III: Evaporation Resistance and Interactions with Plasticizers" . . . pp. 1493-1496.

Journal of Physics: Applied Physics, vol. 15, No. 6, 14 Jun. 1982, "Langmuir-Blodgett Monolayers of Preformed Polymers", pp. 655-658.

*Primary Examiner*—Josephine Barr
*Attorney, Agent, or Firm*—Oblon, Fisher, Spivak, McClelland & Maier

[57] ABSTRACT

Electrically-conducting films comprising at least one monomolecular layer of an organic charge transfer complex and their production process.

These films comprise at least one monomolecular layer of an organic charge transfer complex having at least one electron acceptor group and at least one electron donor group, the electron acceptor and/or donor group having at least one hydrocarbon chain with 16 to 30 carbon atoms and the electron acceptor and/or donor groups being organized in such a way that two adjacent groups of the same type, namely electron donors or electron acceptors, can be sufficiently coupled in the plane of the layer to exchange an electron and ensure an electrical conduction in said plane.

The charge transfer complex can be an alkyl pyridinium-tetracyanoquinodimethane.

18 Claims, No Drawings

ELECTRICALLY CONDUCTING FILMS COMPRISING AT LEAST ONE MONOMOLECULAR LAYER OF AN ORGANIC CHARGE TRANSFER COMPLEX

BACKGROUND OF THE INVENTION

1. Field of the Invention

The present invention relates to electrically conducting films comprising at least one monomolecular layer of an organic charge transfer complex and the process for the production thereof.

2. Discussion of the Background

It is pointed out that organic charge transfer complexes are formed by the association of two molecules whereof one, A, acts as the electron acceptor and the other, D, acts as the electron donor.

This reaction can be represented in the following way:

$$mA + nD \rightarrow A_m^{-\rho}D_n^{+\rho}$$

m and n representing the respective numbers of molecules and $\rho$ the charge transfer corresponding to the proportion of electron transferred. When m=n, there is a simple stoichiometry and when m≠n, there is a complex stoichiometry.

When $\rho \simeq 0$, the complex is a molecular complex in the neutral fundamental state.

When $\rho = 1$, it is a true ionic compound with one electric charge per D or A molecule and when $\rho < 1$, there are fewer electric charges than molecules present. Thus, a mixed valence compound is obtained, which is a necessary condition for obtaining an organic conductor. A distinction can then be made between:

(1) the true charge transfer complexes in which there is a transfer of an electron from the donor to the acceptor, said single electrons then being on $\pi$ orbitals ($\pi$-$\pi$ complexes) and (2) radical ion salts in which only one of the ions is of a radical nature, the counter-ion being diamagnetic.

Complexes of this type are in particular described in Annales de Physique, 1976, Vol. I, No. 4–5, pp. 145-256 and in the Journal de Chimie-Physique, 1982, 79, No. 4.

These complexes produced either chemically or electrochemically crystallize in rows of aligned molecules, which gives a unidimensional conduction and these rows are surrounded throughout by identical parallel rows, whose immediate proximity induces by coupling a "transverse" conduction, i.e. a conduction perpendicular to the preferred direction. These electrically conducting or semiconducting complexes consequently have a dominant unidimensional character, mixed with the tridimensional type.

These complexes are obtained in the form of needles or crystals. However, it would be very interesting to have them in the form of homogeneous conducting films with in particular very thin conductor planes, which are insulated from one another and as would be the case in monomolecular layers.

Thus, for producing certain electronic components, structures of this type are of interest due to their high conduction anisotropy. However, hitherto, it has been impossible to obtain conducting films of this type having monomolecular layers of charge transfer complexes.

Thus, in order to be able to deposit monomolecular layers by the known Langmuir Blodgett process described in the Journal of Am. Chem. Soc. Vol. 57, 1935, pp. 1007 to 1010, it is firstly necessary for the charge transfer complex to be formed by an amphiphilic or amphipathic molecule, i.e. an organic molecule having a hydrophobic part, i.e. a part having a repulsion for polar liquids such as water, and a hydrophilic part, i.e. a part having an affinity for polar liquids, such as water. Thus, on introducing such amphiphilic molecules onto the surface of a liquid such as water, the molecules spread over the liquid surface and orient themselves in such a way that their hydrophilic part is immersed in the water, whereas their hydrophobic part, generally constituted by a hydrocarbon chain, tends to move away therefrom, in such a way that the axis of the chain becomes perpendicular to the surface of the water. If there are adequate cohesion forces between the molecules, the latter remain grouped and limit their spread to a continuous monomolecular film having essentially the thickness of one molecule, which corresponds to a Langmuir film. Such films can be manipulated on the surface of the water, then deposited on a solid support after having been compressed under an appropriate surface pressure. When a support is then introduced into the trough, the monomolecular layer on the surface of the water is deposited on said solid support. In the same way, on extracting a support which has been previously immersed in the trough, a monomolecular layer is deposited on said support and the orientation of the molecules with respect to the support is different as a function of whether deposition has taken place by introducing the support into the trough or by extracting the support from the trough. However, this process cannot be used on the presently known charge transfer complexes, because the latter are not formed from amphiphilic molecules.

However, by substituting one of the molecules of the complex by a hydrophobic hydrocarbon chain, it is possible to obtain amphiphilic complexes. However, the tests carried out up to the present in connection with the deposition of monomolecular layers of the thus substituted, amphiphilic, charge transfer complexes have not made it possible to directly obtain a conducting film. Thus, the charge transfer complexes only have electrically-conducting properties under certain conditions. It is in particular necessary for the molecules to be highly organised in a specific manner, in order to permit both the covering of the conducting orbitals and the partial charge transfer. This organization exists in complexes in the form of powders, but the need to dissolve these complexes in a solution for forming a Langmuir film destroys this organisation. The same applies when using processes involving the deposition of films by evaporation, sublimation, dissolving or any other process requiring a phase of separating the molecules from one another.

SUMMARY OF THE INVENTION

The present invention relates to electrically-conducting films comprising at least one monomolecular layer of amphiphilic molecules of an organic charge transfer complex and to a process for producing films making it possible to obtain a conducting film although the monomolecular layers are deposited by the Langmuir Blodgett method.

The electrically-conducting film according to the invention comprises at least one monomolecular layer of amphiphilic molecules of an organic charge transfer complex, comprising at least one electron acceptor group and at least one electron donor group, the electron acceptor and/or donor group having at least one hydrocarbon chain with 16 to 30 carbon atoms and the electron acceptor and/or donor groups are organized in such a way that two adjacent groups of the same type, namely electron donors or electron acceptors, can be sufficiently coupled in the plane of the layer to exchange an electron and ensure an electrical conduction in said plane.

DETAILED DESCRIPTION OF THE PREFERRED EMBODIMENT

Thus, the films described hereinbefore, have an organization between electron acceptor and/or electron donor groups of the complex, which makes it possible to obtain an electrical conduction in the plane of the layer.

According to a first embodiment of a film according to the invention, the latter comprises several superimposed monomolecular layers of amphiphilic molecules of a charge transfer complex, all these layers defining in the film hydrophilic electrically conductor planes separated from one another by the insulating hydrophobic hydrocarbon chains of the complex.

According to a second embodiment of the film according to the invention, the latter comprises several superimposed monomolecular layers having at least one monomolecular layer of amphiphilic molecules of an electrically-conducting charge transfer complex and at least one monomolecular layer of an electrically insulating amphiphilic compound, the different monomolecular layers being disposed in the film, in such a way that at least two conductor planes formed in two monomolecular layers of the organic conductive charge transfer complex are separated from one another by one or more monomolecular layers of insulating amphiphilic molecules.

In these two embodiments of the film according to the invention, electrically active planes are separated by the electrically inert material, which can be constituted either by the non-conducting part, e.g. by the hydrophobic chains of the molecules of the complex, or by monomolecular layers of an insulating organic compound. This organization gives the conducting films anisotropy properties, i.e. a greater conduction in the plane of the film than along the normal to the film. Thus, through introducing one or more insulating planes between the conductor planes of the film gives the latter a partly dimensional and non-tridimensional character. The importance of this bidimensionality with respect to the basic unidimensionality is also dependent on the structure of the conductive piles in the hydrophilic plane and it is known that the dimensionality of an electrical conductor determines part of its properties (Peierls transition, superconductivity, magnetism, etc). In the case where monomolecular layers of an insulating compound are placed between the monomolecular layers, the conduction anisotropy is reinforced, because in this way single or double conductor planes separated by at least one double-insulating plane are obtained.

It is pointed out that the term single conductor plane is understood to mean the plane defined by the hydrophilic parts of a single monomolecular layer. The term double conductor plane is understood to mean the conductor plane obtained at the interface of two monomolecular layers in which the hydrophilic ends of one layer are in contact with the hydrophilic ends of the following layer.

In these two embodiments of the film according to the invention, it is also possible to obtain the different electrically-conducting monomolecular layers from at least two different charge transfer complexes.

Thus, it is possible to use n complexes and obtain structures of films having one or more layers of a first charge transfer complex, one or more layers of a second charge transfer complex and so on up to the nth charge transfer complex. It is also possible to organize the different layers by intercalating them in an appropriate manner.

On using two different charge transfer complexes, the film according to the invention can comprise:
(a) at least one monomolecular layer of amphiphilic molecules of a first electricity-conducting charge transfer complex,
(b) at least one monomolecular layer of amphiphilic molecules of a second electrically-conducting charge transfer complex, and
(c) at least one monomolecular layer of an electrically insulating amphiphilic compound,
the different monomolecular layers being arranged in the film in such a way that at least two conductor planes formed in the monomolecular layers of the first conductive charge transfer complex and/or in the monomolecular layers of the second conducting charge transfer complex are separated from one another by one or more monomolecular layers of insulating amphiphilic molecules.

Film structures of this type are of particular interest, because, by appropriately choosing the nature, number and distribution of the different layers, it is possible to make the film fulfil specific functions, in the way in which this is done by rectifiers, tunnel diodes and photoconductors in electronics.

In the conductive films according to the invention, the organic charge transfer complexes used are advantageously complexes complying with the formula:

$$DA_xX_y$$

in which D represents an organic electron donor group, A represents an organic electron acceptor group, X represents a non-amphiphilic electron acceptor chosen from among the Lewis acids, x is a number greater than 0 and y is equal to 0 or is a number greater than 0, at least one of the groups D and A being amphiphilic and having a saturated or unsturated hydrocarbon substituent with at least 16 carbon atoms.

Generally, x and y are values which can be up to 20 and the hydrocarbon substituent has at the most 30 carbon atoms. In this complex, the group can represent $I^-$, $PF_6^-$, $ClO_4^-$, $BF_4^-$, $ReO_4^-$, $IO_4^-$, $FSO_3^-$, $AsF_6^-$, $AsF_4^-$, $Br^-$, $Cl^-$ and $MnCl_6^-$, but preferably X represents $I^-$.

In this formula, the organic electron donor group D can represent an aliphatic, aromatic or heterocyclic base preferably having at least one saturated or unsaturated hydrocarbon chain with 16 to 30 carbon atoms.

The aliphatic bases which can be used are in particular quaternary ammonium groups, such as tetraalkyl ammonium.

The aromatic bases which can be used can be constituted by quaternary ammonium groups derived from aniline or substituted derivatives.

The heterocyclic bases which can be used can be constituted by quaternary ammonium groups derived from pyridines, piperidines, bipiperidines, benzopyridines, e.g. quinolines and isoquinolines, acridines, phenazines and phenanthrolines.

The heterocyclic base can also have several hetero atoms of different types, e.g. nitrogen and sulphur atoms, such as N-alkylbenzothiazoles and their substituted derivatives, as well as N-alkyl-indoleninium trimethine cyanines and their substituted derivatives.

The organic electron acceptor group A can be one of the groups generally used in the formation of charge transfer complexes, such as tetracyanoethylene (TCNE), hexacyanobutadiene (HCBD), 1,2,4,5-tetracyanobenzene (TCNB), 7,7,8,8-tetracyanoquinodimethane (TCNQ) and its substituted derivatives, tetracyanodiquinodimethane (TCNDQ), benzotetracyanoquinodimethane (benzo-TCNQ), 2,3,5,6-tetrachloro-p-benzoquinone (CA), trinitrobenzene (TNB), tetranaphthoquinodimethane (TNAP), thiophenetetracyanoquinodimethane (thiophen-TCNQ), selenophen-tetracyanoquinodimethane (selenophen-TCNQ), and tetracyanoquinoquinazolinoquinazoline (TCQQ).

Examples of the charge transfer complexes used in the conducting films of the invention are alkyl pyridinium-tetracyanoquinodimethane and alkyl pyridinium-tetracyanoquinodimethane iodine.

When the film comprises monomolecular layers of a first complex and monomolecular layers of a second complex, the first organic charge transfer complex is an alkyl pyridinium tetracyanoquinodimethane and the second electricity-conducting charge transfer complex is a complex of formula $DA_xX_y$, in which D represents an alkyl pyridinium, A represents tetracyanoquinodimethane (TCNQ) and X represents iodine, with x greater than 0 and y greater than 0. In general, the electrically-conducting charge transfer complexes are complexes of formula $DA_xX_y$, in which D represents an alkyl pyridinium, A represents tetracyanoquinodimethane (TCNQ) and X represents iodine, with $1 < x \leq 2$, when $y=0$.

When the films comprise monomolecular layers of an insulating organic compound, the latter can be a fatty acid such as behenic acid.

The invention also relates to a process for the preparation of conducting films, comprising monomolecular layers of organic charge transfer complexes, which uses the Langmuir Blodgett method for forming the monomolecular layers, but which requires either certain conditions relating to the deposition of the monomolecular layers, or supplementary thermal and chemical treatments for forming a conductive film from said monomolecular layers.

Thus, according to a first embodiment of the conducting film preparation process according to the invention, said process comprises the following stages:
(a) depositing on the surface of a polar liquid a solution of an electricity-conducting, amphiphilic charge transfer comp ex, so as to form a monomolecular layer on the surface of said liquid,
(b) compressing the thus formed monomolecular layer at a pressure higher than that corresponding to a bidimensional phase transition of said charge transfer complex, and
(c) transferring the thus compressed monomolecular layer to a support.

When it is wished to deposit several layers on the same support, operation takes place in the same way and said operations are repeated.

In the first embodiment of the process according to the invention, it is also advantageous to carry out the deposition of the layer by slowly raising the support when the latter is immersed in the liquid, or by lowering it again as rapidly as possible when deposition takes place by the lowering of the substrate into the liquid.

This first embodiment of the process according to the invention consequently makes it possible to directly obtain conducting films by acting on the conditions used for the deposition of the monomolecular layer on the support. Thus, when depositing an octadecyl-pyridinium-TCNQ layer in the conventional manner by compressing the layer at a pressure of 0 to 18 mN/m, which is the normal stability range of the layer in its natural form, an insulating film is obtained. However, on carrying out compression at a value exceeding 20 mN/m, working takes place beyond the bidimensional phase transition of the complex, which permits a reorganisation of the layer and gives it conducting properties.

It is also possible to produce the conducting films according to the invention by depositing monomolecular layers under conventional conditions and by then subjecting the deposited film to thermal and/or chemical treatments. Thus, according to a second embodiment of the process according to the invention, this comprises the following stages:
(a) depositing on an insulating support by the Langmuir Blodgett method one or more monomolecular layers of an organic, electrically-conducting charge transfer complex, and
(b) then subjecting the thus deposited monomolecular layer or layers to a thermal or chemical treatment to make them electricity-conducting.

The chemical treatment can consist of diffusing the iodine into the monomolecular layers deposited on the support. The heat treatment can consist of a heating of the thus deposited layers to a temperature below the melting temperature of the organic charge transfer complex.

This process can in particular be used for forming a conductive docosyl pyridinium tetracyano quinodimethane film by the diffusion of iodine into the deposited layers.

According to a third embodiment of the process according to the invention, one starts with the amphiphilic molecules of an organic charge transfer complex which only slightly conducts or does not conduct electricity and said complex is reacted with an amphiphilic organic compound to make the charge transfer complex conduct electricity.

In this third embodiment of the process, deposition takes place on a support of monomolecular layers of amphiphilic molecules of an organic charge transfer complex which does not conduct electricity and an amphiphilic organic compound able to react with the charge transfer complex in order to make it a conductor of electricity.

The monomolecular layers can be deposited by alternately depositing on the support a monomolecular layer of the non-conducting organic charge transfer complex and a monomolecular layer of the amphiphilic compound.

In this case, the alternating layers are preferably deposited in such a way that the hydrophilic parts of the organic charge transfer complex are in contact with the hydrophilic parts of the amphiphilic compound added in order to aid the reaction between the charge transfer complex and said compound.

In certain cases, all the deposited layers may also be subject to chemical and/or thermal treatments, such as those referred to hereinbefore, in order to increase the effectiveness of the reaction.

In this third embodiment of the process according to the invention, it is also possible to directly form on the surface of a liquid, a monomolecular layer having the non-conducting, amphiphilic, organic charge transfer complex and the amphiphilic compound, followed by the deposition of said layer on a support.

This embodiment of the process according to the invention is particularly appropriate for producing monomolecular layers formed from a charge transfer complex of formula $DA_xX_y$.

In this case, the added amphiphilic compound is generally a compound of X and D, e.g. an alkyl pyridinium iodide and the complex is a compound of D and A, e.g. an alkyl pyridinium-tetracyanoquinodimethane.

When it is wished, according to the invention, to produce a conducting film having layers of organic conducting complexes and layers of insulating compounds, the monomolecular layers of insulating compounds are deposited by once again using the Langmuir Blodgett method. The same is the case when it is wished to deposit monomolecular layers of a first charge transfer complex and monomolecular layers of a second charge transfer complex.

The charge transfer complexes according to the invention can be prepared by conventional methods, such as that described by L. R. Melby et al in Journ. of Am. Chem. Soc. Vol. 84, 1962, pp. 3374–3387.

The complexes of formula $DA_x$ with D representing an organic electron donor group and A an organic electron acceptor group are prepared by reacting a halide of the organic electron donor group D with a salt of the electron acceptor group A, e.g. the iodide of D with the lithium salt of A. It is also possible to react the thus obtained complex with an excess of the electron acceptor group A which generally makes it possible to obtain an organic, electricity-conducting complex. The complexes of formula $DA_xX_y$ can be obtained by reacting a compound of D and X with the organic electron acceptor group A.

The starting compounds used for the preparation of these complexes, e.g. substituted organic bases having a long hydrocarbon chain are obtained by conventional processes. In the same way, the electron acceptor groups A are known compounds, which are also obtained by conventional processes.

The supports used in the invention for the deposition of monomolecular layers are rigid supports having an adequate affinity with respect to the molecules to be deposited. They can e.g. be made from glass, quartz, $CaF_2$, plastics, metals or a metal alloy such as aluminium, stainless steel, nickel, copper, etc.

The following examples are given a non-limitative manner for illustrating the invention.

EXAMPLE 1

This example makes use of the first embodiment of the process for preparing a film constituted by monomolecular layers of octadecyl pyridinium-tetracyanoquinodimethane (ODP-TCNQ).

The charge transfer complex (ODP-TCNQ) is synthesized by hot reacting in an alcoholic solution the octadecyl pyridinium iodide and the tetracyanoquinodimethane lithium salt. After cooling, this gives a powder of the complex which is washed and recrystallized. This complex is then redissolved in acetonitrile with an equivalent of TCNQ. A black complex crystallizes cold and conducts electricity.

A solution containing $5.10^{-4}$ mol.l$^{-1}$ of this complex is prepared in chloroform and this solution is dispersed on the surface of the water of a Langmuir trough. This leads to a monomolecular layer, which is compressed at a pressure of 26 mN.m$^{-1}$ and it is then transferred to an insulating $CaF_2$ support by the Langmuir Blodgett method. The operation is recommenced a number of times in order to obtain on said insulating support a film having 19 superimposed monomolecular layers, which defines 9 electricity-conducting double hydrophilic planes and 1 single electricity-conducting plane.

The film obtained conducts electricity and has a resistivity of 8 Ohm$\times$cm at 20° C. It is blue and its infrared spectrum is that of a semiconductor material. However, if the deposition of the layers takes place after compressing them at a pressure of 18 mN.m$^{-1}$, an insulating film is obtained.

EXAMPLE 2

Starting from the powder of an octadecyl pyridinium tetracyanoquinodimethane (ODP-TCNQ) complex obtained in example 1, two monomolecular layers of said complex are formed and are transferred to a hydrophobic quartz insulating support, whilst operating under the same conditions as those of example 1 and by depositing the layers by lowering and then raising against the support. The film obtained is tinged blue and its resistivity is 25 Ohm$\times$cm at 20° C. It has only one double hydrophilic conductor plane.

EXAMPLE 3

In this example, a conducting film is formed by using the first embodiment of the process, but by alternately depositing on an insulating glass support monomolecular layers of an electricity-conducting charge transfer complex and monomolecular layers of an insulating, amphiphilic organic compound.

Firstly, a chloroform solution containing $5.10^{-4}$ mol.l$^{-1}$ of behenic acid is prepared and it is dispersed on the surface of the distilled water of a Langmuir trough. The layer is then compressed at 35 mN/m and is deposited on the insulating support. This is followed by the preparation of a chloroform solution containing $5.10^{-4}$ mol.l$^{-1}$ of the ODP/TCNQ complex of example 1. This solution is dispersed on the water of the Langmuir trough and the molecular layers are compressed at a pressure of 26 mN/m. In this way, two monomolecular layers of this complex are deposited on the insulating support covered with the behenic acid layer. In the same way, two behenic acid monomolecular layers and two monomolecular layers of the amphiphilic ODP-TCNQ complex are deposited.

In this way, an electrically-conducting film is obtained in the plane with a resistivity of 10 Ohm$\times$cm at 20° C. This film has a very high anisotropy between the resistivity perpendicular to the plane and the resistivity parallel to the plane—the anisotropy exceeds 10.

EXAMPLE 4

This example uses the second embodiment of the process for producing a docosyl pyridinium-tetracyanoquinodimethane (DCP-TCNQ) conducting film.

Firstly, the amphiphilic DCP-TCNQ complex is prepared by metathesis from docosyl pyridinium iodide and TCNQ lithium salt.

The complex obtained is washed and recrystallized. The blue powder of the thus obtained complex is not conductive. This powder is solubilized in a mixture of chloroform and alcohol (5% by volume alcohol) to obtain a solution containing $5.10^{-4}$ mol.l$^{-1}$ of the complex and on the surface of a distilled water-filled Langmuir trough is formed a monomolecular layer, which is compressed at a pressure of 36 mN/m. This layer is then transferred to a CaF$_2$ insulating support previously covered with three monomolecular behenic acid coatings whilst following the operating procedure of example 3. Thus, on said support are deposited 18 coatings of the amphiphilic DCP-TCNQ complex.

The thus obtained blue film is insulating. By iodine diffusion for 1 minute at 20° C., a reorganization of the coatings is brought about, which makes the film violet and conductive. The difference between the hydrophilic planes measured with X-rays is then 48 Å and the resistivity of the conductive part of the film is 20 Ohm×cm at 20° C.

EXAMPLE 5

This example also uses the second embodiment of the process for preparing a conductive film.

The starting product is the same non-conducting DCP-TCNQ powder as in example 4 and under the same conditions as the latter two monomolecular coatings of this complex are deposited on a CaF$_2$ insulating support previously covered with a behenic acid coating following the same operating procedure as in example 4. In this case, the active parts of the two monomolecular layers of the charge transfer complex are adjacent. The insulating film is then treated for 1 minute with iodine at 20° C. The film becomes pale violet and progressively conductive. The resistivity of this conductive plane is 90 Ohm×cm at 20° C.

EXAMPLE 6

In this example, use is made of the third embodiment of the process for obtaining a conductive film. In this case, two purified powders are initially used, one constituted by the semiconducting ODP-TCNQ complex of example 1, whilst the other is of insulating octadecyl pyridinium iodide (ODP).

On the surface of a Langmuir trough subdivided into two compartments by a vertical wall is formed a monomolecular layer of the ODP-TCNQ complex in one of the compartments and a monomolecular layer of ODP iodide in the other compartment, use being made in both cases of a chloroform solution containing $5.10^{-4}$ mol.l$^{-1}$ of ODP-TCNQ complex or ODP iodide. The monomolecular ODP-TCNQ layer is compressed at 26 mN/m and the monomolecular octadecyl pyridinium (ODP) iodide layer at 30 mN/m and a ODP-TCNQ complex layer and a ODP iodide layer are alternately transferred to an insulating CaF$_2$ support. This film then undergoes a heat treatment at 45° C. for 5 minutes, which gives a film whose IR spectrum is no longer characteristic of a semiconductor, but of an organic conductor.

EXAMPLE 7

This example makes use of both the first and second embodiments of the process for the deposition on an insulating support of alternating sequences of layers of charge transfer complexes of different types.

Two layers of the DCP-TCNQ complex of example 4 are firstly deposited on an insulating support covered with a monomolecular behenic acid layer, using the same conditions as in example 4 for depositing both the behenic acid and the complex. This is followed by iodine treatment of the layers obtained as in example 4. This leads to a double conductor plane with the same characteristics as that obtained in example 4. On the same support are then deposited two behenic acid layers under the same conditions as those of example 4, followed by two monomolecular layers of the complex of example 1 (ODP-TCNQ) under the conditions of example 1.

The conductivity of the film obtained in this way is twice as high as that in examples 1 and 4, as well as spectral properties differing from those of the insulated complexes.

EXAMPLE 8

In this example, use is made of the first embodiment of the process for preparing a film constituted by monomolecular 4,7-didocosyl-1,10-phenanthroline-tetracyanoquinodimethane layers.

The charge transfer complex is firstly synthesized by reacting in acetonitrile 2 mmol of 4,7-didocosyl-1,10-phenanthroline with 3 mmol of tetracyanoquinodimethane and 1 mmol of dihydrotetracyanoquinodimethane (TCNQH$_2$). This leads to the precipitation of a black complex in accordance with formula:

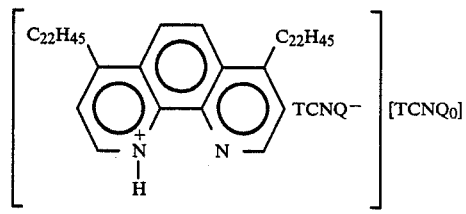

By infrared spectrometry, it is possible to check that this complex is an electrical conductor. The stoichiometry of the black complex obtained by spectrophotometric determination in the visible range of an acetonitrile solution is the characteristic of the aforementioned formula.

This is followed by the preparation of a solution containing $5.10^{-4}$ mol.l$^{-1}$ of said complex in chloroform and the solution is dispersed on the surface of the water of a Langmuir trough. This leads to a monomolecular layer, which is compressed at a pressure of 26 mN/m$^{-1}$ and it is then transferred to an insulating CaF$_2$ support by the Langmuir Blodgett method. The operation is recommenced a number of times to obtain on said insulating support a film with 19 superimposed monomolecular layers, which defines 9 hydrophilic double electrically-conducting planes and one single hydrophilic electrically-conducting plane. The film obtained conducts electricity and has a resistivity of 10 Ohm×cm of 20° C.

EXAMPLE 9

This example makes use of the first embodiment of the process for preparing a film constituted by monomolecular layers of N-methyl-4-octadecyl-5-octadecyloxyquinoliniumtetracyanoquinodimethane.

The complex is firstly synthesized by reacting a solution in the acetonitrile of N-methyl-4-octadecyl-5-octadecyloxyquinolinium iodide, lithium tetracyanoquinodimethanoate (LiTCNQ) and TCNQ. This gives an electrically-conducting complex according to the following formula:

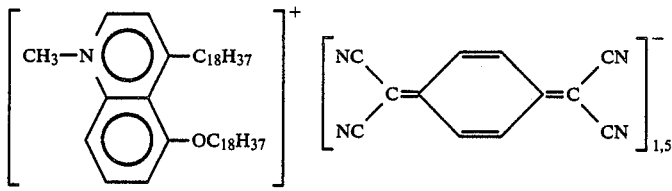

This is followed by the preparation of a solution containing $5.10^{-4}$ mol.l$^{-1}$ of this complex in chloroform and said solution is dispersed on the surface of the water of a Langmuir trough. This gives a monomolecular layer, which is compressed at a pressure of 35 mN.m$^{-1}$ and it is then transferred to an insulating CaF$_2$ support by the Langmuir Blodgett method. This operation is recommenced several times in order to obtain on the insulating support a film having 19 superimposed monomolecular layers, which defines 9 hydrophilic double electrically-conducting planes and one single hydrophilic electrically-conducting plane.

The infrared spectrum of the film obtained is characteristic of an electrically-conducting material.

What is claimed is:

1. An electrically-conducting film, which comprises at least one monomolecular layer of amphiphilic molecules of an organic charge transfer complex of the formula:

DA$_x$X$_y$ wherein:
D is at least one member selected from the group consisting of quaternary ammonium groups, quaternary ammonium groups derived from aniline, quaternary ammonium groups derived from substituted aniline derivatives, quaternary groups derived from pyridines, quaternary ammonium groups derived from pyridines, quaternary ammonium groups derived from bipyridines, quaternary ammonium groups derived from benzopyridines, N-alkylbenzothiazoles, substituted N-alkylbenzothiazole derivatives, N-alkyl-indoleninium trimethine cyanines, and substituted N-alkyl-indoleninium trimethine cyanine derivatives;

A represents an organic electron acceptor group selected from the group consisting of tetracyanoethylene (TCNE), hexacyanobutadiene (HCBD), 1,2,4,5-tetracyanobenzene (TCNB), 7,7,8,8-tetracyanoquinodimethane (TCNQ) and its substituted derivatives, tetracyanodiquinodimethane (TCNDQ), benzotetracyanoquinodimethane (benzo-TCNQ), 2,3,5,6-tetrachloro-p-benzoquinone (CA), trinitro-benzene (TNB), tetranaphthoquinodimethane (TNAP), thiophenetetracyanoquinodimethane (thiophen-TCNQ), selenophen-tetracyanoquinodimethane (selenophen-TCNQ), and tetracyanoquinoquinazoline (TCQQ);

X represents I$^-$, PF$_6^-$, ClO$_4^-$, ReO$_4^-$, IO$_4^-$, AsF$_4^-$, FSO$_3^-$, FSO$_3^-$, AsF$_6^-$, Br$^-$, Cl$^-$ or MnCl$_6^-$;

x is a number greater than 0 and up to 20;

y is equal to 0, or a number greater than 0 and up to 20; and wherein at least one of the groups D and A is amphiphilic and has a saturated or unsaturated hydrocarbon substituent with at least 16 carbon atoms and up to 30 carbon atoms.

2. The conducting film of claim 1, wherein the monomolecular layers are formed from at least two different conductive charge transfer complexes.

3. The conducting film of claim 1, wherein the monomolecular layers are formed from at least two different conductive charge transfer complexes.

4. The film of claim 1, wherein the electrically-conducting organic charge transfer complex or complexes are complexes of formula DA$_x$X$_y$, in which D represents an alkyl pyridinium, A represents tetracyanoquinodimethane, and X represents iodine, with $1 < x \leq 2$ when $y=0$.

5. The film of claim 1, wherein the organic charge transfer complex is a tetracyanoquinodimethane complex.

6. The film of claim 5, wherein the complex is an alkyl pyridinium-tetracyanoquinodimethane.

7. An electrically-conducting film which comprises:
(i) superimposed monomolecular layers having at least two monomolecular layers of amphiphilic molecules of an electricity-conducting charge transfer complex of the formula:

DA$_x$X$_y$ wherein:
is at least one member selected from the group consisting of quaternary ammonium groups, quaternary ammonium groups derived from aniline, quaternary ammonium groups derived from substituted aniline derivatives, quaternary groups derived from pyridines, quaternary ammonium groups derived from pyridines, quaternary ammonium groups derived from bipyridines, quaternary ammonium groups derived from benzopyridines, N-alkylbenzothiazoles, substituted N-alkylbenzothiazole derivatives, N-alkyl-indoleninium trimethine cyanines, and substituted N-alkyl-indoleninium trimethine cyanine derivatives;

A represents an organic electron acceptor group selected from the group consisting of tetracyanoethylene (TCNE), hexacyanobutadiene (HCBD), 1,2,4,5-tetracyanobenzene (TCNB), 7,7,8,8-tetracyanoquinodimethane (TCNQ) and its substituted derivatives, tetracyanodiquinodimethane (TCNDQ), benzotetracyanoquinodimethane (benzo-TCNQ), 2,3,5,6-tetrachloro-p-benzoquinone (CA), trinitro-benzene (TNB), tetranaphthoquinodimethane (TNAP), thiophenetetracyanoquinodimethane (thiophen-TCNQ), selenophen-tetracyanoquinodimethane (selenophen-TCNQ), and tetracyanoquinoquinazoline (TCQQ);

X represents $I^-$, $PF_6^-$, $ClO_4^-$, $ReO_4^-$, $IO_4^-$, $AsF_4^-$, $FSO_3^-$, $FSO_3^-$, $AsF_6^-$, $Br^-$, $Cl^-$ or $MnCl_6^-$;

x is a number greater than 0 and up to 20;

y is equal to 0, or a number greater than 0 and up to 20; and wherein at least one of the groups D and A is amphiphilic and has a saturated or unsaturated hydrocarbon substituent with at least 16 carbon atoms and up to 30 carbon atoms; and (ii) at least one monomolecular layer of an electrically-insulating amphiphilic compound, said electrically-insulating amphiphilic compound being a fatty acid;

wherein the different monomolecular layers are disposed in the film in such a way that at least one monomolecular layer of an organic conductive charge transfer complex is separated from another monomolecular layer of an electricity conducting charge transfer complex by at least one monomolecular layer of insulating amphiphilic molecules.

8. The film of claim 7, wherein the insulating amphiphilic molecules are fatty acid molecules.

9. The film of claim 7, wherein the electrically-conducting organic charge transfer complex or complexes are complexes of formula $DA_xX_y$, in which D represents an alkyl pyridinium, A represents tetracyanoquinodimethane, and X represents iodine, with $1 < x \leq 2$ when $y = 0$.

10. The film of claim 7, wherein the organic charge transfer complex is a tetracyanoquinodimethane complex.

11. The film of claim 10, wherein the complex is an alkyl pyridinium-tetracyanoquinodimethane.

12. The electrically-conducting film of claim 1, wherein D is tetraalkylammonium, a quinoline, an isoquinoline, an acridine, a phenazine or a phenanthroline.

13. The electrically-conducting film of claim 7, wherein D is tetraalkylammonium, a quinoline, an isoquinoline, an acridine, a phenazine, or a phenanthroline.

14. The electrically-conducting film of claim 7, wherein said fatty acid is behenic acid.

15. The electrically-conducting film of claim 1 wherein x is such that $0 < x \leq 2$.

16. The electrically-conducting film of claim 1 wherein $y = 0$.

17. The electrically-conducting film of claim 7 wherein x is such that $0 < x \leq 2$.

18. The electrically-conducting film of claim 7 wherein $y = 0$.

* * * * *